(12) United States Patent
Piazza et al.

(10) Patent No.: US 8,450,199 B2
(45) Date of Patent: May 28, 2013

(54) INTEGRATING DIVERSE TRANSISTORS ON THE SAME WAFER

(75) Inventors: Fausto Piazza, Agrate Brianza (IT); Alfonso Maurelli, Sulbiate (IT)

(73) Assignee: Micron Technology, Inc., Boise, ID (US)

( * ) Notice: Subject to any disclaimer, the term of this patent is extended or adjusted under 35 U.S.C. 154(b) by 342 days.

(21) Appl. No.: 12/341,014

(22) Filed: Dec. 22, 2008

(65) Prior Publication Data

US 2010/0155852 A1    Jun. 24, 2010

(51) Int. Cl.
*H01L 21/3205* (2006.01)
*H01L 21/4763* (2006.01)
*H01L 21/336* (2006.01)

(52) U.S. Cl.
USPC ........... 438/591; 438/595; 438/596; 438/585; 438/303

(58) Field of Classification Search
USPC ................. 438/275, 279, 128, 129, 130, 278, 438/591, 595, 216, 261, 287, 585, 184, 303, 438/257, 584, 596; 257/E21.625, E21.639
See application file for complete search history.

(56) References Cited

U.S. PATENT DOCUMENTS

| | | | |
|---|---|---|---|
| 5,824,584 A * | 10/1998 | Chen et al. | 438/267 |
| 6,482,698 B2 | 11/2002 | Peschiaroli et al. | |
| 6,627,928 B2 | 9/2003 | Peschiaroli et al. | |
| 6,707,079 B2 * | 3/2004 | Satoh et al. | 257/288 |
| 7,015,542 B2 * | 3/2006 | Kasuya | 257/326 |
| 7,144,795 B1 * | 12/2006 | Lines | 438/527 |
| 7,459,390 B2 * | 12/2008 | Niimi et al. | 438/622 |
| 2003/0103382 A1 * | 6/2003 | Kobayashi | 365/185.27 |
| 2007/0262382 A1 * | 11/2007 | Ishii et al. | 257/350 |
| 2008/0203466 A1 * | 8/2008 | Sakai et al. | 257/324 |

\* cited by examiner

*Primary Examiner* — Chuong A. Luu
(74) *Attorney, Agent, or Firm* — Dorsey & Whitney LLP

(57) ABSTRACT

Different types of transistors, such as memory cells, higher voltage, and higher performance transistors, may be formed on the same substrate. A transistor may be formed with a first polysilicon layer covered by a dielectric. A second polysilicon layer over the dielectric may be etched to form a sidewall spacer on the gate of the transistor. The sidewall spacer may be used to form sources and drains and to define sub-lithographic lightly doped drains. After removing the spacer, the underlying dielectric may protect the lightly doped drains.

10 Claims, 2 Drawing Sheets

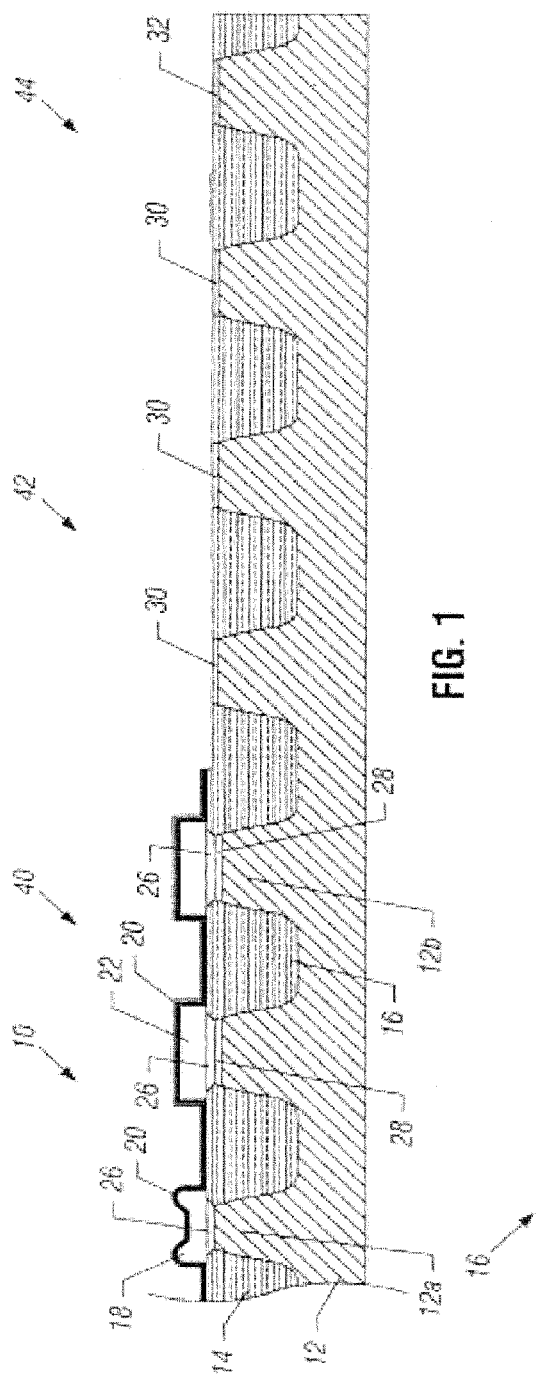
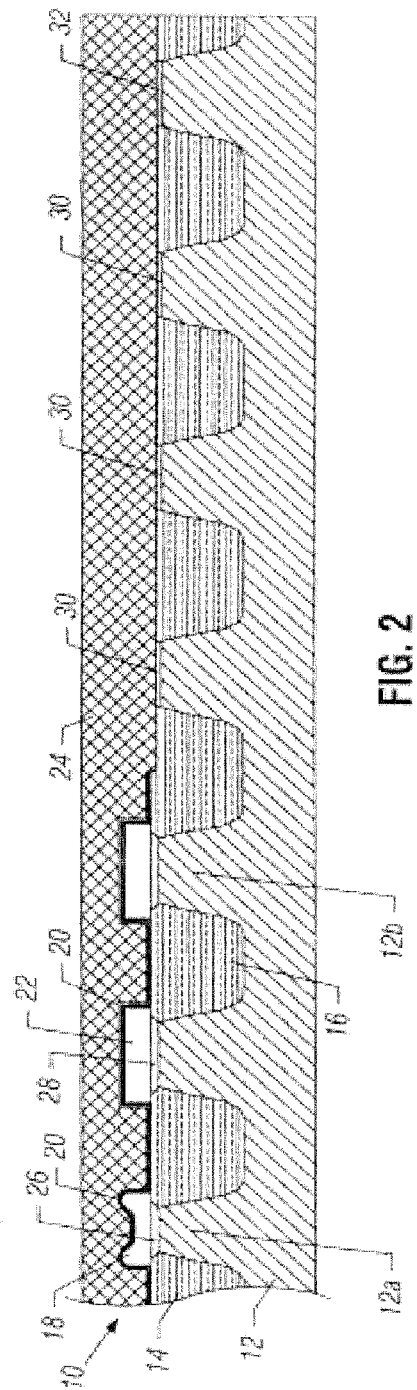

INTEGRATING DIVERSE TRANSISTORS ON THE SAME WAFER

BACKGROUND

This relates to the formation of different types of transistors on the same integrated circuit wafer.

In the course of manufacturing microelectronic memories, such as flash memories, additional circuitry may also be needed to control the flash memory array. The flash memory array may include a matrix of flash memory cells operated under control of control circuits in what may be called the periphery or area outside the array.

These peripheral circuits may include different types of transistors, including relatively lower voltage, higher performance transistors and relatively higher voltage transistors. The characteristics of these transistors differ from each other, as well as from the characteristics of the memory cells, and, thus, advantageously, the processes used to manufacture them are different as well, even where all of these devices are formed on the same wafer.

BRIEF DESCRIPTION OF THE DRAWINGS

FIG. 1 is an enlarged, partial cross-sectional view of one embodiment of the present invention at an early stage of manufacture;

FIG. 2 is an enlarged, partial cross-sectional view after the deposition of the second layer of polysilicon in accordance with one embodiment;

DETAILED DESCRIPTION

Figure 3:
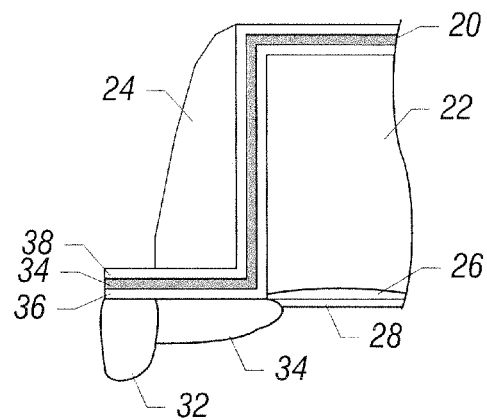
FIG. 3 is a partial, even more greatly enlarged, cross-sectional view of a high voltage transistor gate at an early stage of manufacture according to one embodiment.

In accordance with some embodiments, an integrated circuit may include a flash memory array made up of flash memory cells surrounded by control circuits that include both higher voltage transistors that are capable of handling higher voltages and lower voltage, higher performance transistors. Each of these transistors have different operating functionality and, as a result, have different structural features. Advantageously, in some embodiments, all of these different transistors and the memory cells may be made on the same wafer, without needlessly duplicating microelectronic manufacturing steps.

In accordance with some embodiments that include higher voltage transistors, it is advantageous to begin the production process with the formation of the higher voltage transistor gate structures. Generally, these transistors have a higher thermal budget and have thicker gate oxides than higher performance transistors that operate at lower voltages. Thus, the higher voltage transistor can be fabricated at the beginning of the process flow so that higher performance transistors are not exposed to the higher thermal budget used to fabricate the higher voltage transistors.

Referring to FIG. 1, in some embodiments, a plurality of different types of devices may be formed on one wafer having a single microelectronic substrate 12. For example, in the region 10, an array of memory cells may be formed. The memory array may be in a distinct region and may be surrounded by what may be called peripheral circuits. The peripheral circuits may include transistors used to control the operations of the memory array. Commonly, the configuration of the cells in the memory array is different from that of the transistors in the peripheral circuits.

Thus, in some embodiments, a memory array region 10 may be bounded by regions 40, 42, and 44 that respectively include higher voltage transistors and higher performance transistors of first and second gate oxide types. Within each region, complementary metal oxide microelectronic transistors of both N and P-type may be situated. However, the present invention is not limited to any particular types of transistors, be they memory or peripheral, higher voltage or higher performance transistors.

In order to form different types of transistors, generally, different gate dielectrics and different gate dielectric thicknesses may be utilized. In one embodiment, the gate dielectric 28, for the higher voltage transistors in the region 40, may be formed first. That dielectric may be removed in all areas of the wafer, other than in the region 40 intended to form higher voltage transistors.

Then, the gate dielectric 26 for the memory cells may be patterned, both in the memory cell region 10 and over the periphery regions 40, 42, and 44. That is, the gate dielectric 26 may become the sole gate dielectric of the memory cells and may be a second dielectric layer in the periphery, for example, over the first dielectric layer 28 previously formed for the higher voltage transistors. As a result, the gate dielectric of the higher voltage transistors may be substantially thicker than that of the memory cells and that of the higher performance transistors in the regions 42 and 44. The regions 42 and 44 may each have their own distinct gate dielectric 30 characteristics, in some embodiments.

The memory cells may have first polysilicon gates 18, separated by isolation trenches filled with an oxide 14, in accordance with one embodiment. The gates 18 may all be formed by patterning and etching a single polysilicon layer. The trenches may be formed in a microelectronic substrate 12. While only one gate 18 is shown, a large number of gates may make up a microelectronic memory matrix in some embodiments.

In some cases, adjacent to the cells may be peripheral circuits that include the gates 22 for N and P-channel higher voltage transistors. These higher voltage transistor gates 22 may be formed from the same polysilicon deposition used to form the gates 18 of the memory cells. Thus, the deposited polysilicon may be suitably masked to form the larger gates 22 associated with the higher voltage transistors and the smaller gates 18 associated with the microelectronic memory circuits.

The smaller gates 18 associated with the microelectronic memory circuits 10 may have more upturned edges and may be of smaller size than the gates 22 used for the high voltage transistors in some cases. The upturned edges may be the result of the growth of the oxide 14 and the smaller thickness of the underlying substrate 12a, relative to the substrate 12b under the higher voltage transistors.

In some cases, the trenches between higher voltage transistors may be wider than the trenches between cells. Also, the substrate 12 under each higher voltage transistor may be wider than that under each cell.

The structure shown in FIG. 1 may be the result of the sequence of process steps, such as isolation definition, buried well implant, gate oxide growth for the higher voltage transistors, and well n-channel implants for the memory cells.

After the first polysilicon definition, the higher voltage transistor gates 22 are doped. This is done using a mask. In the n-channel region, a well is implanted. Also in the n-channel region, a threshold adjust and lightly doped drain (LDD) implant may be done. The lightly doped drain implant uses the higher voltage transistor gate 22 as a mask in a self-aligned process. The lightly doped drain implant for the higher voltage transistor is shielded in the channel region by the already defined higher voltage polysilicon gate 22. Thus, the source/drain implants occur on either side of the polysilicon gates 22 (in and out of the page) to form the source and drain portions of the lightly doped drain structure. In connection with the p-channel higher voltage transistors, a p-channel region is implanted.

Then, the inter-polysilicon dielectric 20 is deposited over both the cells in the region 10 and the higher voltage transistors in the region 40. In one embodiment, the inter-polysilicon dielectric 20 is an oxide/nitride/oxide (ONO) stack.

The first polysilicon layer and the inter-polysilicon dielectric 20 may then be removed from the higher performance transistor regions 42 and 44. Then, using two dedicated masks, the N-wells and P-wells, including the threshold voltage adjust for the higher performance transistors are defined.

As shown in FIG. 2, the second polysilicon layer 24 is deposited over the memory region 10 and the higher voltage transistor region 40 and also onto the lower voltage, higher performance transistor regions 42, 44.

A mask may be used to define the word lines in the memory array. This mask may be self-aligned to the second polysilicon layer 24 and the polysilicon gate 18. The source and drain implant for the flash memory cells may be performed using that same mask. The higher performance transistor gate patterning follows. The inter-polysilicon dielectric layer 20 is removed, with a dedicated mask, from the higher performance transistors. This mask is fully opened in the higher performance transistor region and it is shaped in the higher voltage transistor region so that the inter-polysilicon dielectric layer 20 remains on top of the higher voltage transistor gates. A problem arises with respect to the removal of second polysilicon layer 24 from the higher voltage transistor region 40 because of the critical areas of those transistors that are affected by that removal.

Thus, as shown in FIG. 3, the inter-polysilicon dielectric 20 remains on top of the gate 22 and a portion of the second layer 24 of polysilicon is maintained in the form of a sidewall spacer when the second layer 24 is removed by anisotropic etch from the higher performance transistors. The sidewall spacer 24 persists because it is thicker in the vertical direction as a result of its overlapping of the edges of the first polysilicon layer. The higher voltage transistor source and drain regions that will be contacted are cleaned of the inter-polysilicon dielectric 20.

Then, the wells for the higher performance transistors are implanted and the lower voltage transistor gate oxide is grown, while the flash cells have their sources and drains implanted.

The source drain regions 32 of the higher voltage transistors are implanted using the sidewall spacer as a mask, defining the length of the highly doped drain region 34. The second polysilicon layer 24 and the inter-polysilicon dielectric 20 defines a lightly doped drain extension 34 that is protected from the source and drain implants and salicide formation directed to the formation of contacts (not shown) to source/drain regions 32. Therefore, the salicide protect mask can be completely opened in the higher voltage transistor region.

Figure 4:
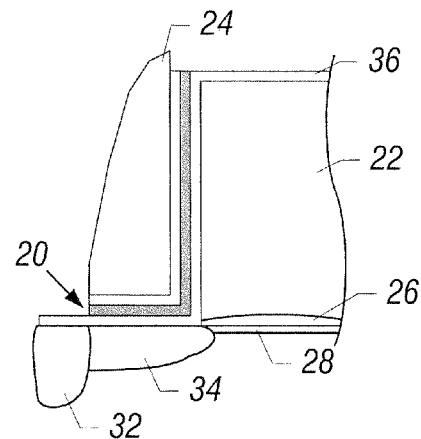
FIG. 4 is an enlarged, cross-sectional view of the high voltage transistor polysilicon gate shown in FIG. 3 after subsequent processing in accordance with one embodiment.

Referring to FIG. 4, the upper layers of the inter-polysilicon dielectric 20, namely, the top oxide layer 30 and the nitride layer 28, may be removed using a suitably selected etchant from over the gate 22. The etchant must be selective versus polysilicon.

Figure 5:
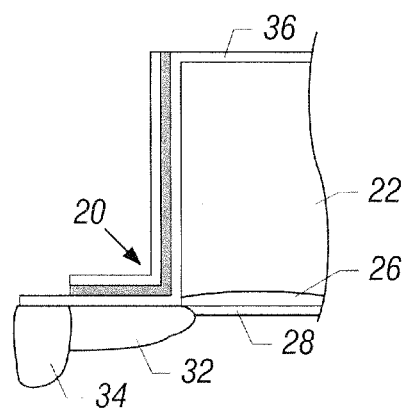
FIG. 5 is an enlarged, cross-sectional view corresponding to FIG. 4 after subsequent processing in accordance with one embodiment.

Then, there is a selective etch of the polysilicon spacer 24 with respect to the oxide layer 30, as shown in FIG. 5. Of course, with some embodiments, both N and P-type higher voltage transistor gates may be provided. In some cases, this may improve performance.

The lightly doped drain extension regions 34 may be reduced from lithographic to sublithographic dimensions. Their dimensions are determined by the width of the sidewall spacer 24, whose width, in turn, is controlled by the time of the anisotropic etch used to form the spacer 24. As a result, the size of the higher voltage transistors may be reduced.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    depositing and patterning a first layer of polysilicon over a substrate;
    forming a dielectric including at least two dielectric layers of different dielectric material;
    forming a second layer of polysilicon over said dielectric;
    forming sidewall spacers from said second layer;
    clearing said dielectric from said substrate where said dielectric is uncovered by said sidewall spacers before removing said sidewall spacers;
    etching to remove said sidewall spacers while leaving the underlying dielectric on the substrate and the sides of the first layer and to remove one of said dielectric layers from on top of said first layer of polysilicon while leaving the other layer on the substrate and on top of the first layer of polysilicon.

2. The method of claim 1 including forming gates of memory cells and peripheral transistors using said first layer.

3. The method of claim 2 including only forming sidewall spacers from said second layer at said peripheral transistors.

4. The method of claim 3 including removing the dielectric from on top of the first layer of said peripheral transistors using said sidewall spacers as a mask.

5. The method of claim 1 including forming a memory array, a first set of transistors outside the memory array, and a second set of transistors outside the memory array, said first set of transistors being higher voltage transistors than said second set of transistors.

6. The method of claim 5 including forming gates of said higher voltage transistors before forming gates of said second set of transistors or said memory array.

7. The method of claim 6 including forming sidewall spacers on the first set of transistors.

8. The method of claim 7 including forming said dielectric over a first layer for the memory array and over a first layer for said higher voltage transistors.

9. The method of claim 8 including forming a first and second dielectric for a higher voltage transistor and applying said second layer of d electric to act as a dielectric for said memory array.

10. The method of claim 1 including forming said dielectric of oxide/nitride/oxide.

* * * * *

UNITED STATES PATENT AND TRADEMARK OFFICE
CERTIFICATE OF CORRECTION

PATENT NO. : 8,450,199 B2  
APPLICATION NO. : 12/341014  
DATED : May 28, 2013  
INVENTOR(S) : Fausto Piazza et al.

Page 1 of 1

It is certified that error appears in the above-identified patent and that said Letters Patent is hereby corrected as shown below:

In the Claims:

In column 5, line 6, in Claim 9, delete "d electric" and insert -- dielectric --, therefor.

Signed and Sealed this
Twenty-third Day of July, 2013

Teresa Stanek Rea
*Acting Director of the United States Patent and Trademark Office*